United States Patent [19]
Hampl, Jr.

[11] 4,180,415
[45] Dec. 25, 1979

[54] HOT-JUNCTION ELECTRODE MEMBERS FOR COPPER/SILVER CHALCOGENIDES

[75] Inventor: Edward F. Hampl, Jr., Saint Paul, Minn.

[73] Assignee: Minnesota Mining and Manufacturing Company, Saint Paul, Minn.

[21] Appl. No.: 828,567

[22] Filed: Aug. 29, 1977

Related U.S. Application Data

[63] Continuation of Ser. No. 526,598, Nov. 25, 1974, abandoned, which is a continuation-in-part of Ser. No. 321,222, Jan. 5, 1973, Pat. No. 3,853,632, which is a continuation of Ser. No. 635,948, Apr. 20, 1967, abandoned, which is a continuation-in-part of Ser. No. 463,148, Jun. 11, 1965, abandoned, and a continuation-in-part of Ser. No. 242,219, Apr. 7, 1972, Pat. No. 3,852,118, which is a continuation of Ser. No. 36,145, May 11, 1970, abandoned, and a continuation-in-part of Ser. No. 291,938, Sep. 25, 1972, Pat. No. 3,873,370.

[51] Int. Cl.² ............... H01L 35/16; H01L 35/04
[52] U.S. Cl. ........................... 136/205; 136/237; 136/238
[58] Field of Search ............ 136/205, 235–238; 252/515; 75/176

[56] References Cited

U.S. PATENT DOCUMENTS

| | | | |
|---|---|---|---|
| 2,157,935 | 5/1939 | Hensel et al. | 75/176 |
| 3,095,330 | 6/1963 | Epstein et al. | 136/238 |
| 3,208,835 | 9/1965 | Duncan et al. | 136/237 |
| 3,272,660 | 9/1966 | Intrater et al. | 136/238 |
| 3,285,017 | 11/1966 | Henderson et al. | 136/238 |
| 3,411,955 | 11/1968 | Weiss | 136/205 |
| 3,638,293 | 2/1972 | Peterson | 252/515 |
| 3,650,844 | 3/1972 | Kendall et al. | 136/205 |
| 3,695,867 | 10/1972 | Skrabek et al. | 136/238 |
| 3,794,526 | 2/1974 | Pryslak | 136/237 |
| 3,852,118 | 12/1974 | Hampl | 136/238 |
| 3,853,632 | 12/1974 | Hampl | 136/238 |
| 3,873,370 | 3/1975 | Hampl et al. | 136/238 |
| 3,988,171 | 10/1976 | Miller et al. | 136/238 |

FOREIGN PATENT DOCUMENTS 106379 1/1939 Australia ........................ 136/238
1292387 10/1972 United Kingdom .

Primary Examiner—Edward A. Miller
Attorney, Agent, or Firm—Cruzan Alexander; Donald M. Sell; Roger R. Tamte

[57] ABSTRACT

Tungsten, molybdenum, and alloys thereof are useful as electrode members for thermoelectric legs made from chalcogenides of copper and/or silver.

2 Claims, 1 Drawing Figure

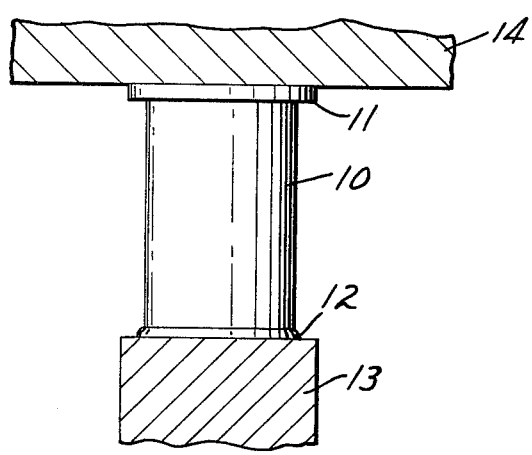

HOT-JUNCTION ELECTRODE MEMBERS FOR COPPER/SILVER CHALCOGENIDES

RELATED APPLICATIONS

This application is a continuation of application Ser. No. 526,598 filed Nov. 25, 1974, and now abandoned, which was a continuation-in-part of three applications: Ser. No. 321,222, now U.S. Pat. No. 3,853,632 filed Jan. 5, 1973, as a continuation of Ser. No. 635,948, which had been filed Apr. 20, 1967, as a continuation-in-part of Ser. No. 463,148, filed June 11, 1965, both of the latter applications being now abandoned; Ser. No. 242,219, now U.S. Pat. No. 3,852,118 filed Apr. 7, 1972 as a continuation of Ser. No. 36,145, filed May 11, 1970 and now abandoned; and Ser. No. 291,938, now U.S. Pat. No. 3,873,370 filed Sept. 25, 1972.

BACKGROUND OF THE INVENTION

Chalcogenides of copper and/or silver have special utility for thermoelectric conversions of heat energy to electrical energy, partly because of the high temperatures to which they may be heated. But these high temperatures also make it difficult to form long-lasting, low-impedance electrical contacts to thermoelectric legs made from the chalcogenides. At the desired high temperature, common metal electrode materials tend to react or interact with the leg. For example, if copper, silver, and iron, which have been successfully used in other thermoelectric constructions, are used as hot-junction electrodes for P-type legs of the described class of compositions, they will migrate into and even through the leg to reduce thermoelectric conversion properties.

Another material previously used as an electrode material—platinum—reacts with copper to form a copper-platinum alloy dispersed as a second phase in the leg, thus removing copper from, and disturbing the carrier concentration of, the chalcogenide phase in which the thermoelectric voltage is generated. Several other materials, such as nickel, tantalum, and niobium, react with selenium at the desired high temperatures to also disturb the carrier concentration of the leg.

Carbon electrodes are chemically inert toward the described family of alloy compositions, and therefore can be useful with them under some conditions. But carbon does not have the desired mechanical strength and conductivity properties of a metal electrode, so that it also is not an adequate answer to the need for useful hot-junction electrode members for the described alloy composition.

SUMMARY OF THE INVENTION

By the present invention, materials based on two particular chemical elements—tungsten and molybdenum—have been found to be especially useful as electrode members for the described class of materials. An electrode member of the invention consists essentially of electrically conductive metal, at least 50 percent of which is metal selected from tungsten and molybdenum. In a thermoelectric generator, the electrode member engages (for example, is pressed against, bonded to, or coated onto) the hot end of a thermoelectric leg or thermoelectric leg segment that consists essentially of the described class of materials.

The preferred thermoelectric materials with which electrode materials of the present invention are used are the P-type telluride and selenide thermoelectric materials described in pending application Ser. No. 321,222 (which is incorporated herein by reference), and which may be concisely defined by the following table:

for telluride compositions,
(a) 32.5 atomic percent $\leq$ tellurium $\leq$ 33.7 atomic percent
(b) 27 atomic percent $\leq$ copper $\leq$ 67 atomic percent
(c) 0 atomic percent $\leq$ silver $\leq$ 40 atomic percent for selenium compositions,
(a) 32.5 atomic percent $\leq$ selenium $\leq$ 33.7 atomic percent
(b) 60 atomic percent $\leq$ copper $\leq$ 67 atomic percent
(c) 0 atomic percent $\leq$ silver $\leq$ 7 atomic percent Of these materials the most preferred are the selenide compositions, especially those that include about one atomic percent silver. Another preferred class of materials are telluride compositions that include between about 32 and 36 atomic percent silver and between about 31 and 35 atomic percent copper. In the preferred materials, selenium or tellurium is slightly in excess of the stoichiometric amount for chalcogen (33.333 atomic percent).

Electrode materials of the invention are also useful with N-type thermoelectric compositions as described in Ser. No. 242,219 (which is incorporated herein by reference), which may be concisely defined by the following table:

60.7 atomic percent $\leq$ silver $\leq$ 67.7 atomic percent
0 atomic percent $\leq$ copper $\leq$ 5 atomic percent
10 atomic percent $\leq$ tellurium $\leq$ 30 atomic percent
3 atomic percent $\leq$ selenium $\leq$ 24 atomic percent
0 atomic percent $\leq$ sulfur $\leq$ 5 atomic percent the total of silver and copper comprising between 65.7 and 67.7 atomic percent of the composition. Of these materials, the preferred compositions include copper (at least 0.1 atomic percent and preferably between about 0.6 and 2 atomic percent), and the ratio of the amount of tellurium and the amount of selenium is about 60 to 40. (Hot-junction electrodes including silver and copper are the most preferred electrode materials for these N-type legs, but electrode materials of tungsten, molybdenum, or their alloys can also be used because of their good chemical compatibility with the described class of compositions).

DESCRIPTION OF THE DRAWINGS

The drawing shows an illustrative thermoelectric leg 10 engaged against hot-junction electrode 11 and soldered by a layer of solder 12 to a cold-junction electrode 13. The hot-junction electrode 11 rests against a heated member 14 such as a flat metal plate that connects two adjacent thermoelectric legs together.

DETAILED DESCRIPTION

Of the electrode materials of the invention, tungsten and alloys in which tungsten is a major ingredient are preferred because of the high degree of inertness between tungsten and the described thermoelectric materials. This high degree of inertness extends to temperatures over 1000° C.

Molybdenum, which is a member of the same chemical family as tungsten, also exhibits a useful compatibility with thermoelectric legs of the described copper-silver-chalcogen family, especially at temperatures less than about 700° C., but also at temperatures above 700° C. At temperatures above 700° C. molybdenum and selenium tend to react to form a molybdenum diselenide. This reaction, which is self-limiting, causes a minor change in thermoelectric properties of the thermoelectric leg because of removal of some selenium from the leg. In addition, the reacted material, which is present as a layer about 50 to 100 microns thick, adds a small amount of electrical resistance to the system.

Notwithstanding its reaction with selenium, molybdenum does not appear to migrate into the leg, which might deleteriously modify the thermoelectric conversion properties of the leg. In general, the reduction in thermoelectric properties because of a reaction between molybdenum and selenium is small enough so that use of molybdenum electrodes above 700° C. is usually acceptable. In fact, since molybdenum is more easily machined than tungsten, its use may be preferred, especially for hot-junction temperatures of less than 700° C.

Both tungsten and molybdenum may be alloyed with each other or with other ingredients to provide useful electrodes. Rhenium is an especially useful alloy ingredient. It is more ductile than tungsten, and by alloying it with tungsten some of the brittleness of tungsten can be reduced. Also alloys of tungsten and rhenium form especially good bonded contacts. To form such contacts, the material of the leg may be melted and cast in a mold against the electrode. Apparently, the alloy of rhenium and tungsten is wet better by the molten material of the leg, so that a more intimate bond is obtained.

With N-type materials there is more latitude in the kind of ingredient that may be alloyed into the tungsten or rhenium. For example, iron may be used as an alloy ingredient with N-type thermoelectric legs, while it is unsuitable for use as a hot-junction for P-type legs.

The electrodes may take various configurations, including flat discs, shallow cup-shaped members that fit over the end of a thermoelectric leg, and even tubular materials that extend around the outside of a cylindrical leg. Or the electrode may be present as a thin disc at the bottom of a recess in a larger cup-shaped member. One especially useful configuration is taught in Norton et al, U.S. Pat. No. 3,496,028, which permits pivoting of a hot-junction electrode to achieve low-resistance connections.

Generally the electrode is made by machining it from a larger ingot of the metal or from a thin sheet or foil. In addition, complex shapes may be formed using powder metallurgy techniques such as those described in Bergstrom, U.S. Pat. No. 3,403,009. The thinner the disc or foil used as an electrode, the more conformable the electrode. Accordingly thin foils—on the order of one mil (25 micrometers) in thickness, for example—of tungsten- or molybdenum-based compositions are especially useful.

The electrodes are generally pressure-engaged to the thermoelectric leg, though they may also be attached to the leg, as with a metallurigical bond. Also in some cases, the electrodes take the form of a thin coating on the leg, which may be formed, for example, by sputtering, or by vapor-or chemical-deposition. Such a coating may also be applied to a support disc or member formed from a different metal than the electrode material.

As described in pending application Ser. No. 291,938, filed Sept. 25, 1972, thermoelectric legs of copper, silver, selenium or tellurium may be advantageously partitioned into two segments and a barrier member placed between the two segments. In effect the barrier member becomes a hot-junction electrode for the lower-temperature segment or segments of such a partitioned leg. Electrodes of the invention are useful as such barrier members, often together with a second member (which may take the form of a coating on a disc-type electrode of the invention) of copper or silver.

The electrode materials should be of good purity, generally including less than 0.1 weight-percent of impurities such as silver, aluminum, copper, silicon, boron, magnesium, calcium, chromium, iron, manganese, nickel, lead, or titanium. Carbon is generally not harmful when present as an impurity.

The invention is further illustrated by the following examples.

EXAMPLE 1

A six-couple thermoelectric generator was prepared using N-type lead telluride legs and P-type legs consisting of about 65.65 atomic percent copper, about 1 atomic percent silver, and about 33.35 atomic percent selenium. Electrode members made from molybdenum and shaped as shallow caps fitting over the ends of the cylindrical legs (of the type described in Norton et al, U.S. Pat. No. 3,496,028 (FIG. 2) were pressure-engaged against the hot end of each P-type leg with a pressure of about 150 pounds per square inch (10.5 kilograms per square centimeter). The cold end of each P-type leg was bonded to a copper-silver eutectic solder. The legs had a length of 0.17 inch (0.4 centimeter) and a diameter of 0.246 inch (0.62 centimeter). The generator was operated with the legs in an argon atmosphere, with the hot junction of the leg maintained at 1000° F. (538° C.) and the cold junction at 300° F. (150° C.). The test ran for over 3200 hours with stable performance. A typical P-type leg produced an average of 0.28 watt of power during this time.

EXAMPLE 2

A cylindrical P-type thermoelectric leg consisting of equal atomic percentages of copper, silver, and tellurium was pressure-engaged at the hot end using a molybdenum electrode as described in Norton et al, U.S. Pat. No. 3,496,028, FIG. 2. The leg was 0.17 inch (0.4 centimeter) long and had a diameter of 0.246 inch (0.62 centimeter). The hot-junction temperature was 1020° F. (550° C.) and the cold-junction temperature was 450° F. (232° C.). The pressure between the hot end of the leg and the electrode was about 68 pounds per square inch (4.8 kilograms per square centimeter). The cold end of the leg was bonded to a copper-silver eutectic solder. The leg was operated in an argon atmosphere for 1465 hours of stable operation. Over this period of time the leg produced an average of 0.241 watt of power.

EXAMPLE 3

The hot end of a cylindrical P-type thermoelectric leg having a composition as described in Example 1 was pressure-engaged with a pressure of about 150 pounds per square inch (10.5 kilograms per square centimeter), against a 10-mil-thick (0.25 millimeter) tungsten disc which rested against the electrically insulated surface of an electric heater. At the cold end the leg was bonded to a copper-silver eutectic solder. The leg was about 0.25 inch (0.63 centimeter in diameter and 0.4 inch (1 centimeter) long. The leg was operated in a vacuum of $1 \times 10^{-4}$ millimeters mercury with a hot-junction temperature of 1630° F. (890° C.) and a cold-junction temperature of 680° F. (360° C.). The leg produced an average of 0.156 watt of power over a short period of operation.

EXAMPLE 4

Three different electrode materials were bonded to cylindrical P-type thermoelectric legs as described in Example 1 and the bond strength between the leg and electrode member tested. Each of the electrodes was a disc 2 mils (50 micrometers) thick, and had a diameter larger than that of the leg. One of the electrodes was tungsten; the next was an alloy consisting of 75 weight-percent tungsten and 25 weight-percent rhenium; and the last was an alloy consisting of 50 weight-percent molybdenum and 50 weight-percent rhenium. All the bonds were made in a graphite mold by placing the electrode disc in the mold and then casting the leg material against the disc. The resulting test element was treated in a tensile tester to determine the bond strength between the leg and electrode member (the test fixture engaged against the portions of the disc extending outside the leg to apply tension to the disc). Each of the test elements exhibited an acceptable bond strength. The tungsten-rhenium alloy exhibited a bond strength of 102 pounds per square inch (7.17 kilograms per square centimeter), the tungsten electrode exhibited a bond strength of 61 pounds per square inch (4.9 kilograms per square centimeter), and the molybdenum-rhenium alloy exhibited a bond strength of 54 pounds per square inch (3.78 kilograms per square centimeter).

EXAMPLES 5-14

A series of tests were conducted using P-type thermoelectric legs as described in Example 3 pressure-engaged at the hot end with 150 pounds per square inch (10.5 kilograms per square centimeter) of pressure against different electrodes of the invention as listed in the following table. The legs were contacted at the cold end in a variety of ways and were operated for different periods of time. Results are given in the table.

| Example No. | Hot-junction Electrode Material and Configuration | Cold-junction Electrode | Temperatures of hot and cold-junctions (C.°) | Time of test (hours) | Average Seebeck coefficient relative to platinum (microvolts/°C.) | Average resistance (milliohms) |
|---|---|---|---|---|---|---|
| 5 | Molybdenum (5-mil (0.125-millimeter) foil) | Carbon disc | 700/300 | 33,500 | 195 | 37.2 |
| 6 | Tungsten (2-mil (0.05-millimeter) foil) | Copper-silver eutectic solder | 700/250 | 29,500 | 280 | 26.6 |
| 7 | Tungsten (2-mil (0.05-millimeter) foil) | Copper-silver eutectic solder | 700/250 | 29,500 | 271 | 29.8 |
| 8 | Tungsten (2-mil (0.05-millimeter) foil) | Copper foil | 800/300 | 29,300 | 293 | 22.1 |
| 9 | Tungsten (2-mil (0.05-millimeter) foil) | Electroplated copper coating | 775/240 | 19,200 | 271 | 32.1 |
| 10 | Tungsten (2-mil (0.05-millimeter) foil) | Copper-silver eutectic solder | 800/250 | 22,100 | 293 | 49.8 |
| 11 | Tungsten (2-mil (0.05-millimeter) foil) | Copper silver eutectic solder | 800/300 | 3,000 | 284 | 43.2 |
| 12 | Tungsten (2-mil (0.05-millimeter) foil) | Copper-silver eutectic solder | 800/300 | 5,500 | 294 | 25.2 |
| 13 | Alloy of 75 weight-percent tungsten and 25 weight-percent rhenium (10-mil (0.25-millimeter) machined disc) | Copper-silver eutectic solder | 800/300 | 1,150 | 281 | 40.2 |
| 14 | Alloy of 75 weight-percent tungsten and 25 weight-percent rhenium (10-mil (0.25-millimeter) machined disc) | Copper-silver eutectic solder | 800/300 | 1,150 | 282 | 43.5 |

What is claimed is:

1. In a thermoelectric generator that includes at least a length of thermoelectric leg consisting essentially of metal ingredients selected from copper and silver and chalcogen ingredients selected from selenium and tellurium; the ingredients of said length of thermoelectric leg being within the following proportions:

for tellurium compositions,
 (a) 32.5 atomic percent ≦ tellurium ≦ 33.7 atomic percent
 (b) 27 atomic percent ≦ copper ≦ 67 atomic percent
 (c) 0 atomic percent < silver ≦ 40 atomic percent for selenium compositions,
 (a) 32.5 atomic percent ≦ selenium ≦ 33.7 atomic percent
 (b) 60 atomic percent ≦ copper ≦ 67 atomic percent
 (c) 0 atomic percent < silver ≦ 7 atomic percent; and a member that engages the hot end of said length of thermoelectric leg to make electrical and thermal contact with said length of leg and consists essentially of electrically conductive metal which comprises at least 50 weight-percent tungsten and in addition rhenium.

2. In a thermoelectric generator that includes at least a length of thermoelectric leg consisting essentially of metal ingredients selected from copper and silver and chalcogen ingredients selected from selenium and tellurium; the ingredients of said length of thermoelectric leg being within the following proportions:

(a) 32.5 atomic percent $\leq$ tellurium $\leq$ 33.7 atomic percent
(b) 27 atomic percent $\leq$ copper $\leq$ 67 atomic percent
(c) 0 atomic percent $<$ silver $\leq$ 40 atomic percent for selenium compositions, (a) 32.5 atomic pressure $\leq$ selenium $\leq$ 33.7 atomic percent
(b) 60 atomic percent $\leq$ copper $\leq$ 67 atomic percent
(c) 0 atomic percent $<$ silver $\leq$ 7 atomic percent; and
a member that engages the hot end of said length of thermoelectric leg to make electrical and thermal contact with said length of leg and consists essentially of tungsten.

* * * * *